US012812819B2

(12) United States Patent
Chang et al.

(10) Patent No.: US 12,812,819 B2
(45) Date of Patent: Nov. 24, 2026

(54) COOLING SYSTEM

(71) Applicant: PEGATRON CORPORATION, Taipei City (TW)

(72) Inventors: Chun-Cheng Chang, Taipei City (TW); Jen-Chieh Shih, Taipei City (TW); Ta-Yung Hsu, Taipei City (TW)

(73) Assignee: PEGATRON CORPORATION, Taipei City (TW)

( * ) Notice: Subject to any disclaimer, the term of this patent is extended or adjusted under 35 U.S.C. 154(b) by 375 days.

(21) Appl. No.: 18/751,916

(22) Filed: Jun. 24, 2024

(65) Prior Publication Data

US 2025/0126760 A1 Apr. 17, 2025

(30) Foreign Application Priority Data

Oct. 13, 2023 (TW) ................................ 112139247

(51) Int. Cl.
*H05K 7/20* (2006.01)

(52) U.S. Cl.
CPC ......... *H05K 7/20781* (2013.01); *H05K 7/203* (2013.01); *H05K 7/20327* (2013.01); *H05K 7/20836* (2013.01)

(58) Field of Classification Search
CPC ........... H05K 7/20236; H05K 7/20272; H05K 7/203; H05K 7/20327; H05K 7/20781; H05K 7/20836
See application file for complete search history.

(56) References Cited

U.S. PATENT DOCUMENTS

| | | | | |
|---|---|---|---|---|
| 2010/0236772 A1* | 9/2010 | Novotny | ............ | H05K 7/20836 165/287 |
| 2023/0397367 A1* | 12/2023 | Hu | ............................ | F01P 7/14 |
| 2025/0098109 A1* | 3/2025 | King | .................. | H05K 7/20772 |
| 2026/0059712 A1* | 2/2026 | Gao | .......................... | F25B 5/02 |

FOREIGN PATENT DOCUMENTS

| | | |
|---|---|---|
| CN | 102389886 A | 3/2012 |
| CN | 114438295 A | 5/2022 |
| CN | 114784418 A | 7/2022 |
| CN | 116449928 A | 7/2023 |
| CN | 116568005 A | 8/2023 |

* cited by examiner

*Primary Examiner* — Jacob R Crum
(74) *Attorney, Agent, or Firm* — MUNCY, GEISSLER, OLDS & LOWE, P.C.

(57) ABSTRACT

The present invention discloses a cooling system which is suitable for being used in cooperation with a heat dissipation tank, and includes a filter unit, two working units, and two control valve groups arranged at the working units. The filter unit includes a filter, an inlet end, and an outlet end. The outlet end of the filter unit is connected to a liquid inlet of the heat dissipation tank. Each of the working units includes a driving assembly and a heat exchange assembly, each of the driving assemblies includes a first end, a second end, and a driving pump, the first end is connected to a liquid outlet of the heat dissipation tank, the second end is connected to the inlet end of the filter unit and one end of the heat exchange assembly, and another end of the heat exchange assembly is connected to the liquid inlet.

14 Claims, 7 Drawing Sheets

COOLING SYSTEM

CROSS REFERENCE TO RELATED APPLICATIONS

This application claims the priority benefit of Taiwan application serial no. 112139247, filed on Oct. 13, 2023. The entirety of the above-mentioned patent application is hereby incorporated by reference herein and made a part of this specification.

BACKGROUND

Technical Field

The present invention relates to a cooling system, and in particular, to an immersion cooling system used to cool a server.

Description of Related Art

Immersion cooling is a type of liquid cooling technology. For example, by directly immersing a server in a non-conductive coolant, heat energy generated by a component of the server is transferred to the coolant, and the coolant whose temperature rises is cooled in a manner of circulation cooling and then flows back to continue absorbing the heat energy of the server. Therefore, no other active cooling components (for example, a fan) are needed to cool the server. This helps to improve energy efficiency.

In an immersion cooling system, a general method is that the coolant flows in a pipeline in a cooling distribution unit (CDU), and the coolant in the pipeline is pushed into a filter through a pump to filter out impurities.

However, a current practice is that the coolant passes through a filter element of the filter in a single channel (pipeline). In this case, the coolant encounters a specific degree of resistance in the filter, and therefore, a flow rate and a pressure of the coolant flowing out of the filter are insufficient. As a result, a power of the pump needs to be increased to allow the coolant to normally flow through the filter and a subsequent heat exchanger, and then enter a heat dissipation tank to cool the server. This results in increased energy consumption of the cooling system, and the pump is more susceptible to failure.

SUMMARY

An objective of the present invention is to provide a cooling system, to enable a circulation pump that pushes a coolant to flow to be less susceptible to failure, so that normal operation and cooling performance of a server are not affected.

To achieve the foregoing objective, the present invention proposes a cooling system, suitable for being used in cooperation with a heat dissipation tank, where the heat dissipation tank accommodates at least one server and includes a liquid outlet and a liquid inlet, and the cooling system includes a filter unit, two working units, and two control valve groups. The filter unit includes an inlet end, an outlet end, and a filter arranged between the inlet end and the outlet end, and the outlet end of the filter unit is connected to the liquid inlet. Each of the working units includes a driving assembly and a heat exchange assembly, each of the driving assemblies includes a first end, a second end, and a driving pump arranged between the first end and the second end, the first end is connected to the liquid outlet, the second end is connected to the inlet end of the filter unit and one end of the heat exchange assembly, and another end of the heat exchange assembly is connected to the liquid inlet. The control valve groups are respectively arranged at the two working units. When the cooling system is in a cooling mode, each of the control valve groups blocks communication between the second end of each of the driving assemblies and the inlet end of the filter unit. When the cooling system is in a filtration mode, one of the control valve groups blocks the communication between the second end of one of the driving assemblies and the inlet end of the filter unit, and the other of the control valve groups blocks communication between the second end of the other of the driving assemblies and the corresponding heat exchange assembly.

In an embodiment, one of the driving assemblies is a first driving assembly, the other one of the driving assemblies is a second driving assembly, one of the heat exchange assemblies includes a first heat exchanger, the other one of the heat exchange assemblies includes a second heat exchanger, one of the control valve groups includes a first control valve, and the other of the control valve groups includes a second control valve. The first control valve is arranged between an outlet end of the first heat exchanger and the liquid inlet, or is arranged between an inlet end of the first heat exchanger and the second end of the first driving assembly. The second control valve is arranged between an outlet end of the second heat exchanger and the liquid inlet, or is arranged between an inlet end of the second heat exchanger and the second end of the second driving assembly.

In an embodiment, the cooling system further includes a control unit electrically connected to each of the control valve groups, where one of the control valve groups further includes a third control valve, and the other of the control valve groups further includes a fourth control valve. The third control valve is arranged between the second end of the first driving assembly and the inlet end of the filter unit. The fourth control valve is arranged between the second end of the second driving assembly and the inlet end of the filter unit.

In an embodiment, in the cooling mode, the control unit controls the first control valve and the second control valve to open, and controls the third control valve and the fourth control valve to close.

In an embodiment, in the filtration mode, the control unit controls the first control valve and the fourth control valve to open, and the second control valve and the third control valve to close; or controls the first control valve and the fourth control valve to close, and the second control valve and the third control valve to open.

In an embodiment, the cooling system further includes a control unit electrically connected to each of the control valve groups, where the driving assemblies are a first driving assembly and a second driving assembly respectively, the heat exchange assemblies respectively include a first heat exchanger and a second heat exchanger, one of the control valve groups includes a third control valve, and the other of the control valve groups includes a fourth control valve. The third control valve is a three-way valve and arranged at a second end of the first driving assembly. The fourth control valve is a three-way valve and arranged at a second end of the second driving assembly.

In an embodiment, in the cooling mode, the control unit controls switching of the third control valve and the fourth control valve, to block communication between the first driving assembly and the inlet end of the filter unit and between the second driving assembly and the inlet end of the filter unit, respectively, and enable a coolant to flow from the first driving assembly to the first heat exchanger and from the second driving assembly to the second heat exchanger.

In an embodiment, in the filtration mode, the control unit controls switching of the third control valve and the fourth control valve, to enable a coolant to flow from the first driving assembly to the first heat exchanger and from the second driving assembly to the filter, or enable the coolant to flow from the first driving assembly to the filter and from the second driving assembly to the second heat exchanger.

In an embodiment, the cooling system further includes a sensing unit. The sensing unit includes at least one sensor electrically connected to the control unit, where the sensor is at the filter unit, the heat dissipation tank, or a pipeline through which a coolant flows each of the working units. The sensor outputs a sensing signal while sensing that a temperature of the coolant or a quality parameter exceeds a set value, and the control unit controls, according to the sensing signal, the cooling system to switch from the cooling mode to the filtration mode or from the filtration mode to the cooling mode.

In an embodiment, the control unit regularly switches the cooling system from the cooling mode to the filtration mode.

In an embodiment, the cooling system further includes a cooling unit. The cooling unit includes a cooler, an inlet end, and an outlet end. Wherein the inlet end and the outlet end of the cooling unit are connected to the cooler and the heat exchange assemblies.

To achieve the foregoing objective, the present invention further proposes a cooling system, suitable for cooling at least one server. The cooling system includes a heat dissipation tank, a filter unit, two working units, and two control valve groups. The heat dissipation tank is suitable for accommodating the at least one server, and includes a liquid outlet and a liquid inlet. The filter unit includes an inlet end, an outlet end, and a filter arranged between the inlet end and the outlet end, and the outlet end of the filter unit is connected to the liquid inlet. Each of the working units includes a driving assembly and a heat exchange assembly, each of the driving assemblies includes a first end, a second end, and a driving pump arranged between the first end and the second end, the first end is connected to the liquid outlet, the second end is connected to the inlet end of the filter unit and one end of the heat exchange assembly, and another end of the heat exchange assembly is connected to the liquid inlet. The control valve groups are respectively arranged at the two working units. When the cooling system is in a cooling mode, each of the control valve groups blocks communication between the second end of each of the driving assemblies and the inlet end of the filter unit. When the cooling system is in a filtration mode, one of the control valve groups blocks the communication between the second end of one of the driving assemblies and the inlet end of the filter unit, and the other of the control valve groups blocks communication between the second end of the other of the driving assemblies and the corresponding heat exchange assembly.

Accordingly, a difference from an existing immersion cooling system is that in the cooling system in the present invention, a backup assembly is added, and the cooling system may operate in the (full) cooling mode or the filtration mode through switching of the control valve groups. In the (full) cooling mode, the two working units may simultaneously perform cooling functions. In the filtration mode, one of working units performs the cooling function, while the other of working units may perform a filtering function, to balance lifespan of driving pumps of the two driving assemblies, making the driving pumps less prone to failure. In addition, when components of one of the working units need to be shut down for repair or replacement due to maintenance or failure, components of the other of the working units may continue to operate. Therefore, normal operation and cooling performance of the server are not affected.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION

Figure 1:
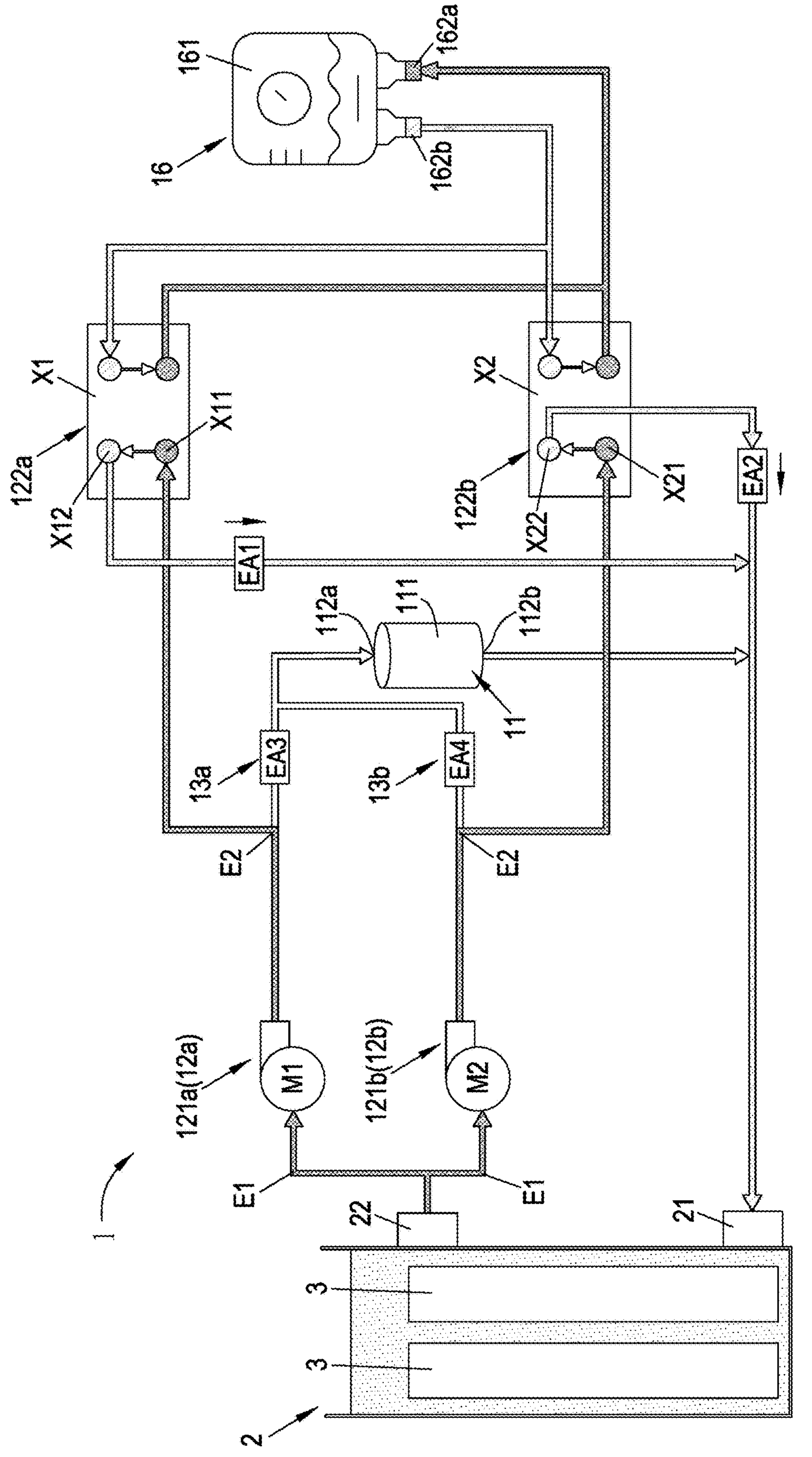
FIG. 1 is a schematic diagram of a cooling system operating in a cooling mode according to an embodiment of the present invention.

A cooling system in an embodiment of the present invention is described below with reference to related drawings, where the same components are described by using the same reference numerals. Components appearing in the following embodiments are only configured to describe relative relationships of the components, and do not represent proportions or sizes of actual components.

First, it should be noted that, in the drawings of the following embodiments, although a pipeline through which a coolant flows is not specifically shown or noted, it should be understood by a person with ordinary knowledge in the art that, there is a pipeline connected between units (or components), or between a unit (or a component) and an outlet end and between a unit (or a component) an inlet end, and the coolant may flow in the pipeline.

Figure 2:
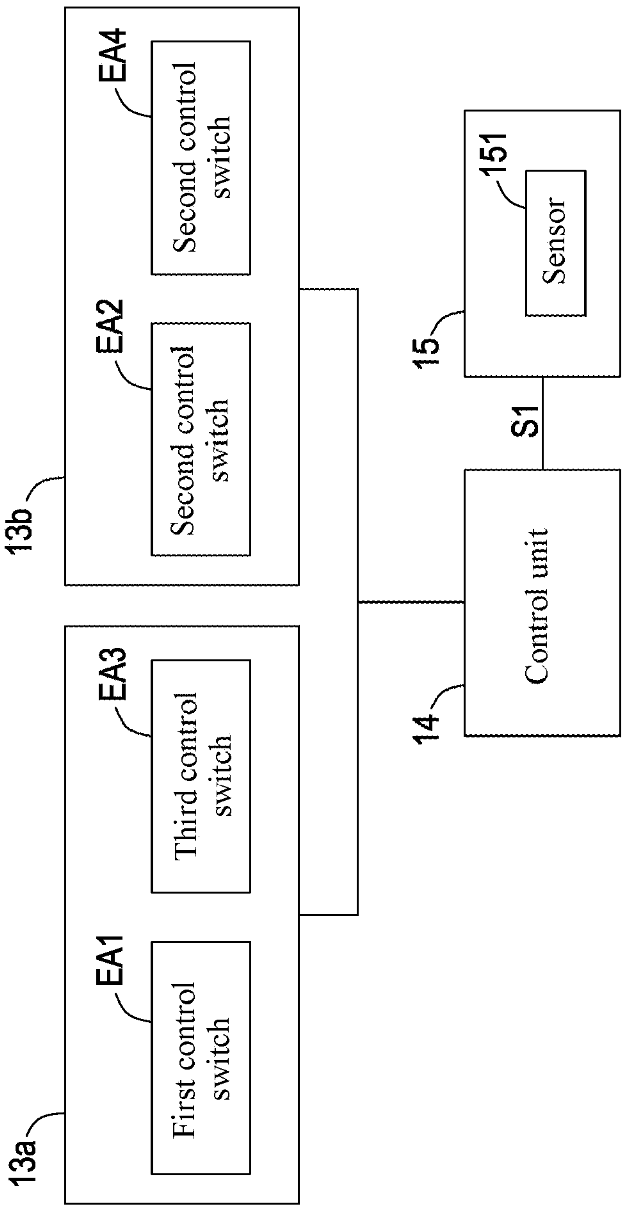
FIG. 2 is a functional block diagram of a cooling system according to an embodiment of the present invention.
Figure 3A:
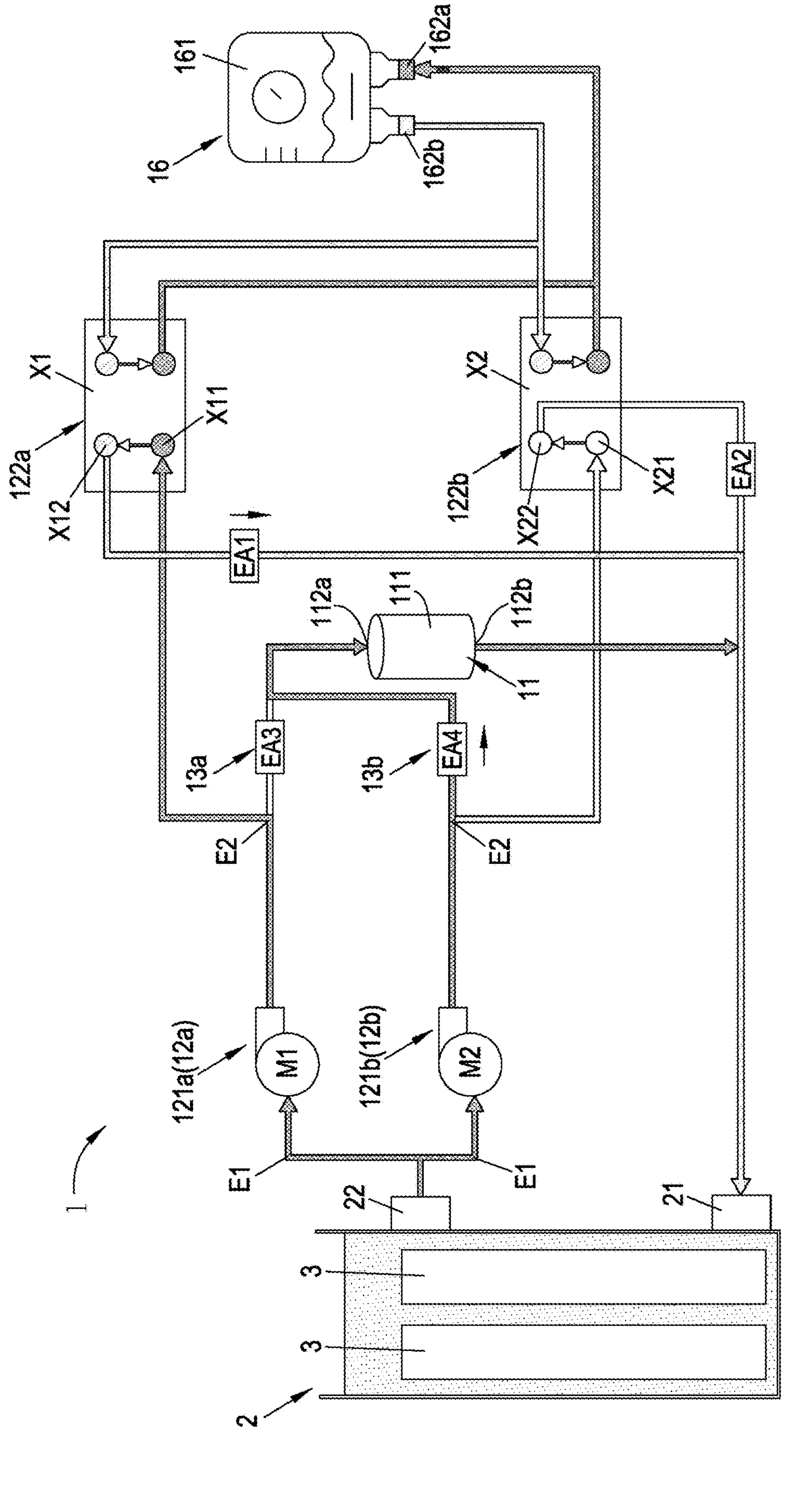
FIG. 3A and FIG. 3B are schematic diagrams of a cooling system operating in a filtration mode according to an embodiment of the present invention.
Figure 3B:
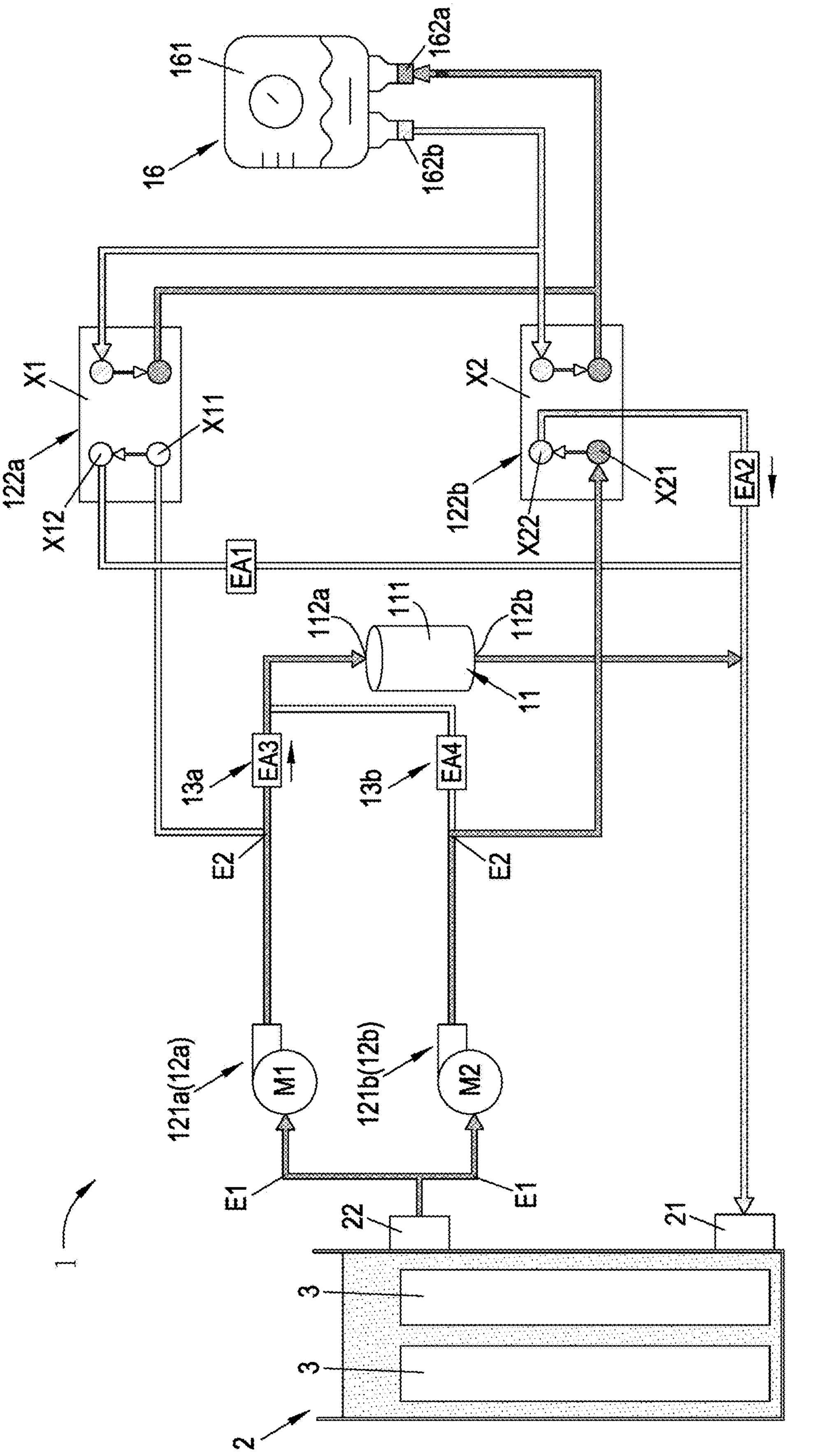

FIG. 1 is a schematic diagram of a cooling system operating in a cooling mode according to an embodiment of the present invention. FIG. 2 is a functional block diagram of a cooling system according to an embodiment of the present invention. FIG. 3A and FIG. 3B are schematic diagrams of a cooling system operating in a filtration mode according to an embodiment of the present invention.

First, referring to FIG. 1 and FIG. 2, the cooling system 1 in this embodiment is suitable for being used in cooperation with a heat dissipation tank 2. The cooling system 1 is an immersion cooling system. The heat dissipation tank 2 may accommodate at least one server 3 (where in FIG. 1, an example in which two servers 3 are accommodated is used), and has a liquid inlet 21 and a liquid outlet 22. A low-temperature and non-conductive coolant may enter the heat dissipation tank 2 through the liquid inlet 21 located on a lower side of the heat dissipation tank 2. After taking away heat generated by the server 3, the coolant may leave from the liquid outlet 22 located on an upper side of the heat dissipation tank 2, to perform heat dissipation on the server 3.

The cooling system 1 includes a filter unit 11, two working units 12*a* and 12*b*, and two control valve groups 13*a* and 13*b*. In addition, the cooling system 1 in this embodiment further includes a control unit 14 (FIG. 2).

The filter unit 11 includes a filter 111, and an inlet end 112*a* and an outlet end 112*b* located on two sides of the filter 111. The filter 111 includes a filter element, configured to filter impurities or a foreign object in a coolant. The outlet end 112*b* of the filter unit 11 is connected to the liquid inlet 21 of the heat dissipation tank 2 through a pipeline.

One of the working units 12*a* includes a driving assembly 121*a* and a heat exchange assembly 122*a*, and the other of the working units 12*b* includes a driving assembly 121*b* and a heat exchange assembly 122*b*. The driving assembly 121*a* is arranged in cooperation with the heat exchange assembly 122*a*, and the driving assembly 121*b* is arranged in cooperation with the heat exchange assembly 122*b*. The driving assembly 121*a* includes a first end E1, a second end E2, and a driving pump M1 arranged between the first end E1 and the second end E2. The driving assembly 121*b* includes a first end E1, a second end E2, and a driving pump M2 arranged between the first end E1 and the second end E2. The driving pumps M1 and M2 may provide power to push the coolant, to enable the coolant to circulate in the pipeline. The first end E1 of each of the driving assemblies 121*a* and 121*b* is connected to the liquid outlet 22, and the second end E2 of each of the driving assemblies 121*a* and 121*b* is connected to one end of each of the heat exchange assemblies 122*a* and 122*b*, and is simultaneously connected to the inlet end 112*a* of the filter unit 11. In addition, another end of each of the heat exchange assemblies 122*a* and 122*b* is connected to the liquid inlet 21. In addition, the control valve groups 13*a* and 13*b* are respectively arranged at the two working units 12*a* and 12*b*.

When the cooling system 1 is in a (full) cooling mode, each of the control valve groups 13*a* and 13*b* may block the coolant flowing through each of the driving assemblies 121*a* and 121*b* from passing through the filter unit 11. In addition, when the cooling system 1 is in a filtration mode, one of the control valve groups 13*a* and 13*b* may block the coolant flowing through the driving assembly of one of the working units from passing through the filter unit 11, and the other of the control valve groups 13*a* and 13*b* may block the coolant flowing through the driving assembly of the other of the working units from passing through the heat exchange assembly of the working unit.

Specifically, as shown in FIG. 1, the working unit 12*a* in this embodiment includes a first driving assembly 121*a* and a heat exchange assembly 122*a* correspondingly connected to the first driving assembly 121*a*. The working unit 12*b* includes a second driving assembly 121*b* and a heat exchange assembly 122*b* correspondingly connected to the second driving assembly 121*b*. The driving pump M1 is located between the first end E1 and the second end E2 of the first driving assembly 121*a*, and the driving pump M2 is located between the first end E1 and the second end E2 of the second driving assembly 121*b*. In addition, the second end E2 of the first driving assembly 121*a* and the second end E2 of the second driving assembly 121*b* are connected to the inlet end 112*a* of the filter unit 11.

In addition, the two ends of the heat exchange assembly 122*a* are respectively connected to the second end E2 of the corresponding first driving assembly 121*a* and the liquid inlet 21, and the two ends of the heat exchange assembly 122*b* are respectively connected to the second end E2 of the corresponding driving assembly 121*b* and the liquid inlet 21. The heat exchange assembly 122*a* includes a first heat exchanger X1, and the heat exchange assembly 122*b* includes a second heat exchanger X2. In an embodiment, the first heat exchanger X1 and the second heat exchanger X2 are, for example, but not limited to, plate heat exchangers.

In addition, the control valve group 13*a* (or referred to as a first control valve group 13*a*) includes a first control valve EA1 and a third control valve EA3, and the control valve group 13*b* (or referred to as a second control valve group 13*b*) includes a second control valve EA2 and a fourth control valve EA4. In this embodiment, the first control valve EA1 is arranged between an outlet end X12 of the first heat exchanger X1 and the liquid inlet 21, and an inlet end X11 of the first heat exchanger X1 is connected to the second end E2 of the first driving assembly 121*a*. The second control valve EA2 is arranged between an outlet end X22 of the second heat exchanger X2 and the liquid inlet 21, and an inlet end X21 of the second heat exchanger X2 is connected to the second end E2 of the second driving assembly 121*b*. The third control valve EA3 is arranged between the second end E2 of the first driving assembly 121*a* and the inlet end 112*a* of the filter unit 11. The fourth control valve EA4 is arranged between the second end E2 of the second driving assembly 121*b* and the inlet end 112*a* of the filter unit 11. An example in which the first control valve EA1, the second control valve EA2, the third control valve EA3, and the fourth control valve EA4 in this embodiment are electric valves is used, but it is not limited thereto. In different embodiments, the first control valve EA1, the second control valve EA2, the third control valve EA3, and/or the fourth control valve EA4 may also be manual valves, or a combination of manual valves and electric valves. This is not limited in the present invention.

As shown in FIG. 2, the control unit 14 is electrically connected to each of the control valve groups 13*a* and 13*b*. The control unit 14 may include forms such as software, hardware, or firmware, and is electrically connected to the first control valve EA1 and the third control valve EA3 of the control valve group 13*a*, and the second control valve EA2 and the fourth control valve EA4 of the control valve group 13*b*, to control these control valves (EA1 to EA4) to open or close. When the control valve is opened, the coolant may pass through the control valve; and when the control valve is closed, the coolant may be blocked, so that the coolant cannot pass through the control valve. In an embodiment, the control unit 14 may include, for example, but not limited to, a programmable logic controller (Programmable Logic Controller, PLC).

In addition, referring to FIG. 1, the cooling system 1 in this embodiment may further include a cooling unit 16. The cooling unit 16 includes a cooler 161, an inlet end 162*a*, and an outlet end 162*b*, wherein the inlet end 162*a* and the outlet end 162*b* of the cooler 161 are connected to the cooler and the heat exchange assemblies 122*a* and 122*b*. The inlet end 162*a* and the outlet end 162*b* of the cooler 161 are connected to the first heat exchanger X1, and the inlet end 162*a* and the outlet end 162*b* of the cooler 161 are also connected to the second heat exchanger X2. In an embodiment, the cooler 161 is, for example, but not limited to, a cooling water tower of an air conditioning system. Cooling water (and the cooler 161) of the air conditioning system is used to respectively perform heat exchange with the first heat exchanger X1 and the second heat exchanger X2, so that a temperature of the coolant at the outlet end X12 of the first heat exchanger X1 and at the outlet end X22 of the second heat exchanger X2 may be lower than a temperature of the coolant at the inlet end X11 of the first heat exchanger X1 and the inlet end X21 of the second heat exchanger X2.

Therefore, when the cooling system 1 is in the (full) cooling mode, the control unit 14 controls the first control valve EA1 and the second control valve EA2 to open, so that the coolant may pass through the heat exchange assemblies 122*a* and 122*b* (the first heat exchanger X1 and the second heat exchanger X2). In addition, the control unit 14 further controls the third control valve EA3 and the fourth control valve EA4 to close, to block communication between the second end E2 of each of the driving assemblies 121*a* and 121*b* and the inlet end 112*a* of the filter unit 11, thereby blocking the coolant from passing through the filter unit 11. Specifically, after the coolant pushed by the driving pumps M1 and M2 enters the first heat exchanger X1 and the second heat exchanger X2 respectively to perform heat exchange, the cooled coolant enters the heat dissipation tank 2 from the liquid inlet 21 through the first control valve EA1 and the second control valve EA2 respectively to cool the server 3. After heat of the server 3 is taken away, the high-temperature coolant flows out from the liquid outlet 22 and respectively flows to the driving pumps M1 and M2 according to circulation, and continues to perform a next cooling cycle.

In addition, as shown in FIG. 3A, when the cooling system 1 is in the filtration mode, the control unit 14 controls the second control valve EA2 and the third control valve EA3 to close. Therefore, communication between the second end E2 of the driving assembly 121*a* and the inlet end 112*a* of the filter unit 11 may be blocked, that is, the coolant flowing through the first driving assembly 121*a* of the working unit 12*a* may be blocked from passing through the filter unit 11. In addition, communication between the second end E2 of the driving assembly 121*b* and the corresponding heat exchange assembly 122*b* is also blocked, that is, the coolant flowing through the second driving assembly 121*b* of the working unit 12*b* is blocked from passing through the corresponding heat exchange assembly 122*b* (the second heat exchanger X2). In addition, the control unit 14 further controls the first control valve EA1 and the fourth control valve EA4 to open, so that the coolant pushed by the driving pump M1 may pass through the heat exchange assembly 122*a* (the first heat exchanger X1) corresponding to the working unit 12*a* (the first driving assembly 121*a*) and then enter the heat dissipation tank 2. In addition, the coolant pushed by the driving pump M2 may pass through the filter unit 11 to perform filtering. In this way, the coolant performs heat exchange through the first heat exchanger X1, and the coolant pushed by the driving pump M2 may be further simultaneously filtered. Therefore, when the cooling system 1 is in the filtration mode, the coolant pushed by the driving pump M1 still maintains a function of cooling the server 3, while the coolant pushed by the driving pump M2 may perform filtering work and flow back to the heat dissipation tank 2.

In addition, as shown in FIG. 3B, when the cooling system 1 is in another filtration mode, the control unit 14 controls the first control valve EA1 and the fourth control valve EA4 to close. Therefore, communication between the second end E2 of the driving assembly 121*b* and the inlet end 112*a* of the filter unit 11 may be blocked, that is, the coolant flowing through the second driving assembly 121*b* of the working unit 12*b* may be blocked from passing through the filter unit 11. In addition, communication between the second end E2 of the driving assembly 121*a* and the corresponding heat exchange assembly 122*a* is also blocked, that is, the coolant flowing through the first driving assembly 121*a* of the working unit 12*a* is blocked from passing through the corresponding heat exchange assembly 122*a* (the first heat exchanger X1). In addition, the control unit 14 further controls the second control valve EA2 and the third control valve EA3 to open, so that the coolant pushed by the driving pump M1 may pass through the filter unit 11. In addition, the coolant pushed by the driving pump M2 may pass through the corresponding heat exchange assembly 122*b* (the second heat exchanger X2) of the working unit 12*b* (the second driving assembly 121*b*). In this way, the coolant performs heat exchange through the second heat exchanger X2, and the coolant pushed by the driving pump M1 may be further simultaneously filtered. Therefore, when the cooling system 1 is in the filtration mode, the coolant pushed by the driving pump M2 still maintains a function of cooling the server 3, while the coolant pushed by the driving pump M1 may perform filtering work and flow back to the heat dissipation tank 2.

Referring to FIG. 2, the cooling system 1 in this embodiment further includes a sensing unit 15. The sensing unit 15 includes at least one sensor 151 electrically connected to the control unit 14, where the sensor 151 may be arranged at the filter unit 11, the heat dissipation tank 2, or a pipeline through which the coolant flows each of the working units 12*a* and 12*b* (for example, may be arranged at a pipeline of each of the driving assemblies 121*a* and 121*b* or in the filter unit 11). The sensor 151 is configured to sense a temperature of the coolant (to sense whether the temperature is too high) or quality of the coolant (for example, to sense whether the coolant has too many impurities or foreign objects, or viscosity is too high).

Therefore, in the cooling system 1, the sensor 151 may output a sensing signal S1 while sensing that the temperature or a quality parameter (for example, viscosity) of the coolant exceeds a set value, and the control unit 14 controls, according to the sensing signal S1, the cooling system 1 to automatically switch to the filtration mode or the cooling mode. For example, the sensor 151 is a temperature sensor. When the sensor 151 senses that the temperature of the coolant does not exceed a predetermined value, the filtration mode is maintained; and when the sensor 151 senses that the temperature of the coolant rises and exceeds the predetermined value, the control unit 14 controls the cooling system 1 to automatically switch from the filtration mode to the cooling mode. Alternatively, the sensor 151 is a viscosity sensor. When the sensor 151 senses that the viscosity of the coolant does not exceed a predetermined value, the cooling mode is maintained; and when the sensor 151 senses that the viscosity of the coolant exceeds the predetermined value, the control unit 14 controls the cooling system 1 to automatically switch from the cooling mode to the filtration mode. In some embodiments, a plurality of sensors 151 may be arranged at different locations in the pipeline through which the coolant flows. When one of the sensors 151 senses an abnormality in a temperature or quality of the coolant, the cooling system 1 may automatically switch to the filtration mode or the cooling mode. This is not limited in the present invention.

In another embodiment, the control unit 14 may also regularly (for example, in every 20 minute) enable the cooling system 1 to switch between the cooling mode and the filtration mode (to be specific, regularly perform filtering). In another embodiment, when a set time period does not expire (for example, the filtration mode is in progress for 13 minutes but does not reach 20 minutes), if the sensor 151 senses an abnormality in the temperature of the coolant (or the server 3), such as a sudden and rapid increase, the control unit 14 may control the cooling system 1 to forcefully enter the cooling mode.

It is particularly noted that, a person skilled in the art may understand that, in the foregoing cooling system 1, the first control valve EA1 is arranged between the outlet end X12 of the first heat exchanger X1 and the liquid inlet 21, and the second control valve EA2 is arranged between the outlet end X22 of the second heat exchanger X2 and the liquid inlet 21. However, in different embodiments, the first control valve EA1 may also be arranged between the inlet end X11 of the first heat exchanger X1 and the second end E2 of the first driving assembly 121*a*, and the second control valve EA2 may also be arranged between the inlet end X21 of the second heat exchanger X2 and the second end E2 of the second driving assembly 121*b*, or any combination thereof. This does not affect normal operation of the cooling system 1.

Accordingly, a difference from an existing immersion cooling system is that in the cooling system 1 in this embodiment, a backup assembly (two working units 12*a* and 12*b*) is added, and the cooling system 1 may operate in the (full) cooling mode and the filtration mode through switching of the control valve groups (the control valves). In the (full) cooling mode, two working units 12*a* and 12*b* may simultaneously perform cooling functions. In the filtration mode, one of the working units performs the cooling function, while the other of the working units may simultaneously perform a filtering function, to balance lifespan of the two driving pumps M1 and M2, making the driving pumps M1 and M2 less prone to failure. In addition, when a component (such as a driving pump or a heat exchanger) of one of working units or the filter unit 11 (the filter element) needs to be shut down for repair or replacement due to maintenance or failure, normal operation and cooling performance of the server 3 are not affected.

Figure 4:
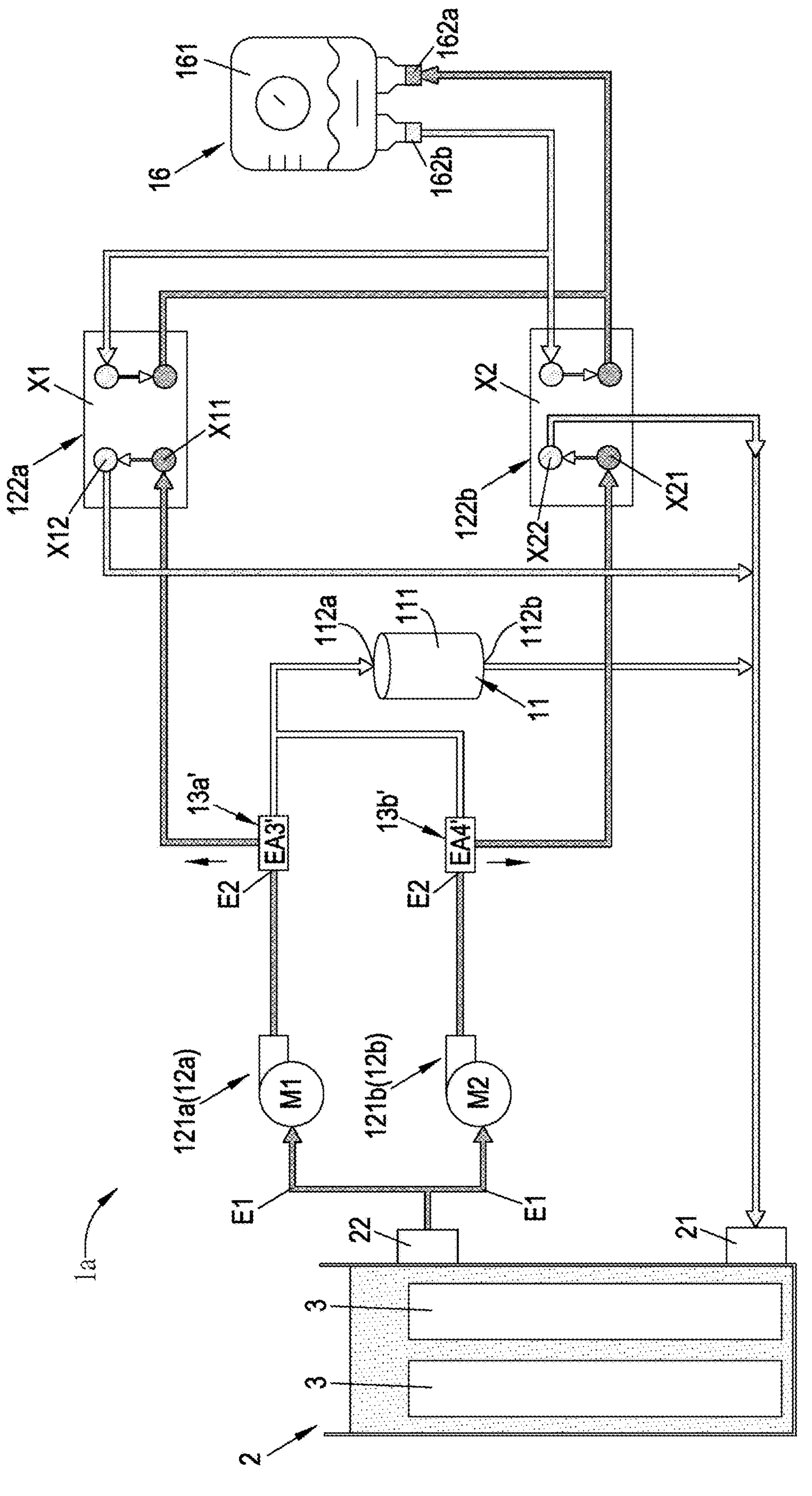
FIG. 4 is a schematic diagram of a cooling system operating in a cooling mode according to another embodiment of the present invention.
Figure 5A:
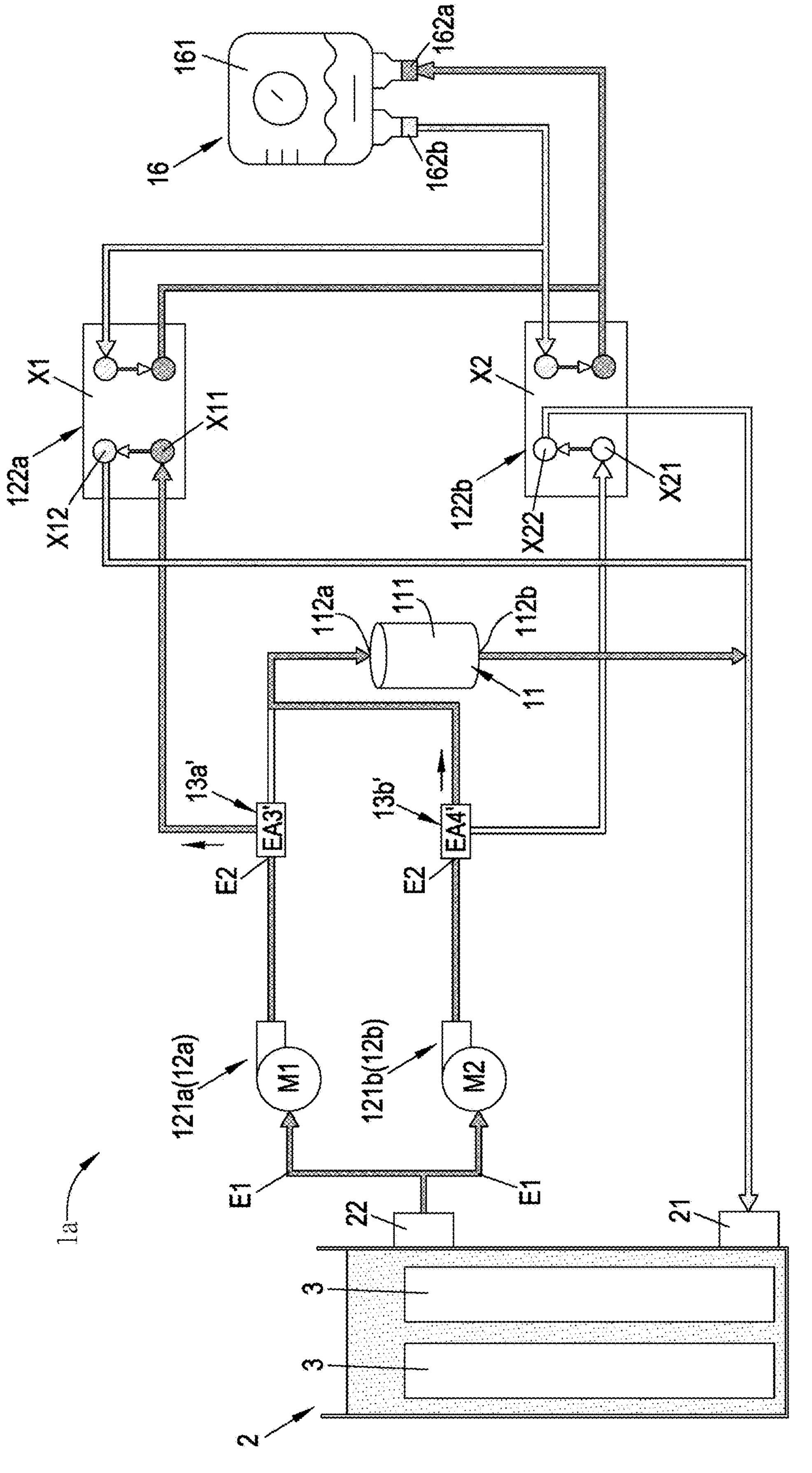
FIG. 5A and FIG. 5B are schematic diagrams of a cooling system operating in a filtration mode according to another embodiment of the present invention.
Figure 5B:
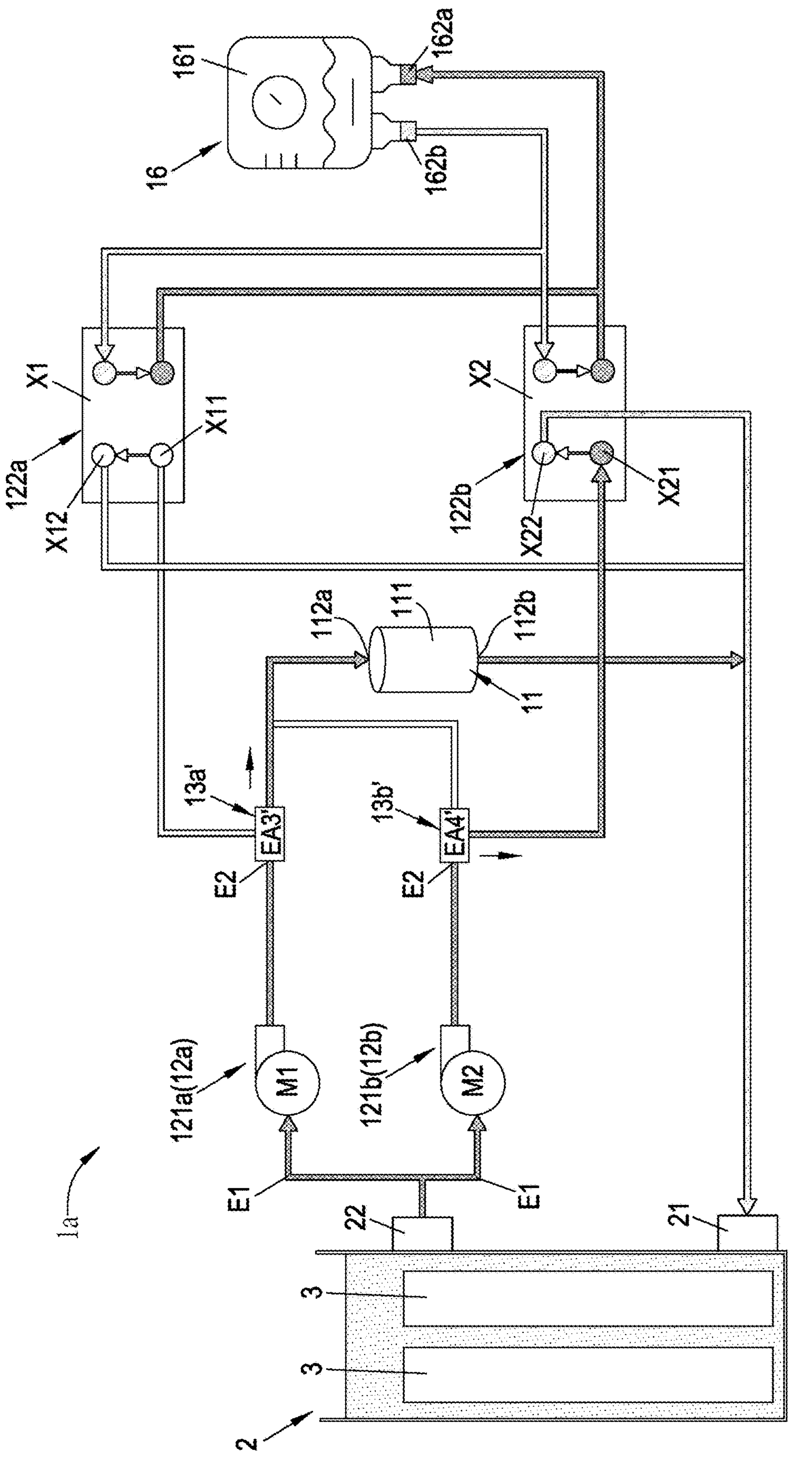

FIG. 4 is a schematic diagram of a cooling system 1*a* operating in a cooling mode according to another embodiment of the present invention. FIG. 5A and FIG. 5B are schematic diagrams of a cooling system 1*a* operating in a filtration mode according to another embodiment of the present invention.

First, referring to FIG. 4, the cooling system 1*a* is substantially the same as the cooling system 1 in the foregoing embodiment. A main difference from the cooling system 1 is that the third control valve EA3' of the cooling system 1*a* in this embodiment is a three-way valve and arranged at the second end E2 of the first driving assembly 121*a*, and the fourth control valve EA4' is also a three-way valve and arranged at the second end E2 of the second driving assembly 121*b*. In this embodiment, both the third control valve EA3' and the fourth control valve EA4' are electric three-way valves, and the control unit 14 is still electrically connected to the third control valve EA3' and the fourth control valve EA4'. However, it is not limited thereto. In different embodiments, the third control valve EA3' and/or the fourth control valve EA4' may be manual valves, or a combination of manual valves and electric valves. This is not limited in the present invention. It is particularly noted that, the first control valve EA1 and the second control valve EA2 do not need to be arranged in the cooling system 1*a* in this embodiment, and normal operation of the cooling mode and the filtration mode can still be achieved.

Therefore, as shown in FIG. 4, when the cooling system 1*a* is in the (full) cooling mode, the control unit 14 controls switching of the third control valve EA3' and the fourth control valve EA4', to block communication between the first driving assembly 121*a* and the inlet end 112*a* of the filter unit 11 and between the second driving assembly 121*b* and the inlet end 112*a* of the filter unit 11, respectively, so that the coolant pushed by the driving pumps M1 and M2 respectively passes through the first heat exchanger X1 and the second heat exchanger X2 from the first driving assembly 121*a* and the second driving assembly 121*b* (that is, does not pass through the filter unit 11), and enters the heat dissipation tank 2 through the liquid inlet 21, to cool the server 3 in the heat dissipation tank 2.

In addition, in FIG. 5A, when the cooling system 1*a* is in the filtration mode, the control unit 14 controls switching of the third control valve EA3', to block the communication between the first driving assembly 121*a* and the inlet end 112*a* of the filter unit 11, so that the coolant may flow from the first driving assembly 121*a* to the first heat exchanger X1 instead of flowing to the filter 111, and enter the heat dissipation tank 2 through the liquid inlet 21, to cool the server 3 in the heat dissipation tank 2. In addition, the control unit 14 further controls switching of the fourth control valve EA4', to block the communication between the second driving assembly 121*b* and the heat exchange assembly 122*b*, so that the coolant may flow from the second driving assembly 121*b* to the filter 111 instead of flowing to the heat exchange assembly 122*b* to perform filtering.

In addition, in FIG. 5B, when the cooling system 1*a* is in another filtration mode, the control unit 14 controls switching of the third control valve EA3', to block the communication between the first driving assembly 121*a* and the heat exchange assembly 122*a*, so that the coolant flows from the first driving assembly 121*a* to the filter 111 instead of flowing to the heat exchange assembly 122*a* to perform filtering. In addition, the control unit 14 further controls switching of the fourth control valve EA4', to block the communication between the second driving assembly 121*b* and the inlet end 112*a* of the filter unit 11, so that the coolant may flow from the second driving assembly 121*b* to the second heat exchanger X2 instead of flowing to the filter 111, and enter the heat dissipation tank 2 through the liquid inlet 21, to cool the server 3 in the heat dissipation tank 2.

In addition, in another embodiment of the cooling system, in addition to assemblies such as the filter unit 11, the working units 12*a* and 12*b*, the control valve groups 13*a* and 13*b*, the control unit 14, the sensing unit 15, and the cooling unit 16, the cooling system may also include the heat dissipation tank 2. Connection relationships and functions of the filter unit 11, the working units 12*a* and 12*b*, the control valve groups 13*a* and 13*b*, the control unit 14, the sensing unit 15, the cooling unit 16, and the heat dissipation tank 2 are described in detail in the foregoing embodiments. This is not described herein again.

In summary, a difference from an existing immersion cooling system is that in the cooling system in the present invention, a backup assembly is added, and the cooling system may operate in the (full) cooling mode or the filtration mode through switching of the control valve groups. In the (full) cooling mode, two working units may simultaneously perform cooling functions. In the filtration mode, one of the working units performs the cooling function while the other of the working units may perform a filtering function, to balance lifespan of driving pumps of the two driving assemblies, making the driving pumps less prone to failure. In addition, when components of one of the working units need to be shut down for repair or replacement due to maintenance or failure, components of the other of the working units may continue to operate. Therefore, normal operation and cooling performance of the server are not affected.

The foregoing are only exemplary but not limited descriptions. Any equivalent modifications or changes that do not depart from the spirit and scope of the present invention shall fall within the scope of the appended claims below.

What is claimed is:

1. A cooling system, suitable for being used in cooperation with a heat dissipation tank, wherein the heat dissipation tank accommodates at least one server and comprises a liquid outlet and a liquid inlet, and the cooling system comprises:

a filter unit, comprising an inlet end, an outlet end, and a filter arranged between the inlet end and the outlet end, and the outlet end of the filter unit is connected to the liquid inlet;

two working units, wherein each of the working units comprises a driving assembly and a heat exchange assembly, each of the driving assemblies comprises a first end, a second end, and a driving pump arranged between the first end and the second end, the first end is connected to the liquid outlet, the second end is connected to the inlet end of the filter unit and one end of the heat exchange assembly, and another end of the heat exchange assembly is connected to the liquid inlet; and two control valve groups, respectively arranged at the two working units, wherein when the cooling system is in a cooling mode, each of the control valve groups blocks communication between the second end of each of the driving assemblies and the inlet end of the filter unit; and when the cooling system is in a filtration mode, one of the control valve groups blocks the communication between the second end of one of the driving assemblies and the inlet end of the filter unit, and the other of the control valve groups blocks communication between the second end of the other of the driving assemblies and the corresponding heat exchange assembly.

2. The cooling system according to claim 1, wherein one of the driving assemblies is a first driving assembly, the other one of the driving assemblies is a second driving assembly, one of the heat exchange assemblies comprises a first heat exchanger, the other one of the heat exchange assemblies comprises a second heat exchanger, one of the control valve groups comprises a first control valve, and the other of the control valve groups comprises a second control valve, wherein the first control valve is arranged between an outlet end of the first heat exchanger and the liquid inlet, or is arranged between an inlet end of the first heat exchanger and the second end of the first driving assembly; and the second control valve is arranged between an outlet end of the second heat exchanger and the liquid inlet, or is arranged between an inlet end of the second heat exchanger and the second end of the second driving assembly.

3. The cooling system according to claim 2, further comprising a control unit electrically connected to each of the control valve groups, wherein one of the control valve groups further comprises a third control valve, and the other of the control valve groups further comprises a fourth control valve, wherein the third control valve is arranged between the second end of the first driving assembly and the inlet end of the filter unit; and the fourth control valve is arranged between the second end of the second driving assembly and the inlet end of the filter unit.

4. The cooling system according to claim 3, wherein in the cooling mode, the control unit controls the first control valve and the second control valve to open, and controls the third control valve and the fourth control valve to close.

5. The cooling system according to claim 3, wherein in the filtration mode, the control unit controls the first control valve and the fourth control valve to open, and the second control valve and the third control valve to close; or controls the first control valve and the fourth control valve to close, and the second control valve and the third control valve to open.

6. The cooling system according to claim 3, further comprising:

a sensing unit, comprising at least one sensor electrically connected to the control unit, wherein the sensor is arranged at the filter unit, the heat dissipation tank, or a pipeline through which a coolant flows in each of the working units, wherein the sensor outputs a sensing signal while sensing that a temperature of the coolant or a quality parameter exceeds a set value, and the control unit controls, according to the sensing signal, the cooling system to switch from the cooling mode to the filtration mode or from the filtration mode to the cooling mode.

7. The cooling system according to claim 3, wherein the control unit regularly switches the cooling system from the cooling mode to the filtration mode.

8. The cooling system according to claim 1, further comprising a control unit electrically connected to each of the control valve groups, wherein one of the driving assemblies is a first driving assembly, the other one of the driving assemblies is a second driving assembly, one of the heat exchange assemblies comprises a first heat exchanger, the other one of the heat exchange assemblies comprises a second heat exchanger, one of the control valve groups comprises a third control valve, and the other of the control valve groups comprises a fourth control valve, wherein the third control valve is a three-way valve and arranged at a second end of the first driving assembly; and the fourth control valve is a three-way valve and arranged at a second end of the second driving assembly.

9. The cooling system according to claim 8, wherein in the cooling mode, the control unit controls switching of the third control valve and the fourth control valve, to block communication between the first driving assembly and the inlet end of the filter unit and between the second driving assembly and the inlet end of the filter unit, respectively, and enable a coolant to flow from the first driving assembly to the first heat exchanger and from the second driving assembly to the second heat exchanger.

10. The cooling system according to claim 8, wherein in the filtration mode, the control unit controls switching of the third control valve and the fourth control valve, to enable a coolant to flow from the first driving assembly to the first heat exchanger and from the second driving assembly to the filter, or enable the coolant to flow from the first driving assembly to the filter and from the second driving assembly to the second heat exchanger.

11. The cooling system according to claim 8, further comprising:

a sensing unit, comprising at least one sensor electrically connected to the control unit, wherein the sensor is arranged at the filter unit, the heat dissipation tank, or a pipeline through which a coolant flows in each of the working units, wherein the sensor outputs a sensing signal while sensing that a temperature of the coolant or a quality parameter exceeds a set value, and the control unit controls, according to the sensing signal, the cooling system to switch from the cooling mode to the filtration mode or from the filtration mode to the cooling mode.

12. The cooling system according to claim 8, wherein the control unit regularly switches the cooling system from the cooling mode to the filtration mode.

13. The cooling system according to claim 1, further comprising:

a cooling unit, comprising a cooler, an inlet end, and an outlet end, wherein the inlet end and the outlet end of the cooling unit are connected to the cooler and the heat exchange assemblies.

14. A cooling system, suitable for cooling at least one server, wherein the cooling system comprises:

a heat dissipation tank, suitable for accommodating the at least one server, wherein the heat dissipation tank comprises a liquid outlet and a liquid inlet;

a filter unit, comprising an inlet end, an outlet end, and a filter arranged between the inlet end and the outlet end, and the outlet end of the filter unit is connected to the liquid inlet;

two working units, wherein each of the working units comprises a driving assembly and a heat exchange assembly, each of the driving assemblies comprises a first end, a second end, and a driving pump arranged between the first end and the second end, the first end is connected to the liquid outlet, the second end is connected to the inlet end of the filter unit and one end of the heat exchange assembly, and another end of the heat exchange assembly is connected to the liquid inlet; and two control valve groups, respectively arranged at the two working units, wherein when the cooling system is in a cooling mode, each of the control valve groups blocks communication between the second end of each of the driving assemblies and the inlet end of the filter unit; and when the cooling system is in a filtration mode, one of the control valve groups blocks the communication between the second end of one of the driving assemblies and the inlet end of the filter unit, and the other of the control valve groups blocks communication between the second end of the other of the driving assemblies and the corresponding heat exchange assembly.

* * * * *